United States Patent
Hirase et al.

(10) Patent No.: US 9,954,045 B2
(45) Date of Patent: Apr. 24, 2018

(54) ELECTROLUMINESCENCE DEVICE AND METHOD FOR PRODUCING SAME

(71) Applicant: Sharp Kabushiki Kaisha, Sakai, Osaka (JP)

(72) Inventors: Takeshi Hirase, Sakai (JP); Tetsuya Okamoto, Sakai (JP); Tohru Senoo, Sakai (JP); Tohru Sonoda, Sakai (JP); Seiji Fujiwara, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/305,112

(22) PCT Filed: Apr. 30, 2015

(86) PCT No.: PCT/JP2015/062958
§ 371 (c)(1),
(2) Date: Oct. 19, 2016

(87) PCT Pub. No.: WO2015/170657
PCT Pub. Date: Nov. 12, 2015

(65) Prior Publication Data
US 2017/0040399 A1 Feb. 9, 2017

(30) Foreign Application Priority Data
May 7, 2014 (JP) .................. 2014-096093

(51) Int. Cl.
*H01L 27/32* (2006.01)
*H01L 51/50* (2006.01)
(Continued)

(52) U.S. Cl.
CPC ...... *H01L 27/3262* (2013.01); *H01L 27/3276* (2013.01); *H01L 51/50* (2013.01);
(Continued)

(58) Field of Classification Search
None
See application file for complete search history.

(56) References Cited

U.S. PATENT DOCUMENTS

2004/0046497 A1* 3/2004 Schaepkens .......... B82Y 20/00
313/506
2004/0175957 A1 9/2004 Lukas et al.
(Continued)

FOREIGN PATENT DOCUMENTS

JP 2007-200890 A 8/2007
JP 2008-153004 A 7/2008
(Continued)

OTHER PUBLICATIONS

Official Communication issued in International Patent Application No. PCT/JP2015/062958, dated Jul. 7, 2015.

*Primary Examiner* — Lex Malsawma
(74) *Attorney, Agent, or Firm* — Keating & Bennett, LLP

(57) ABSTRACT

Provided is an organic EL display device (electroluminescence device) including a TFT substrate (substrate) and an organic EL element (electroluminescence device) provided on the TFT substrate, wherein the organic EL display device includes a sealing layer that seals the organic EL element. The sealing layer is provided with a first, a second, and a third sealing film that are sequentially stacked from the organic EL element side, the first and third sealing films are each formed of an inorganic film, and the second sealing film is formed of an octamethylcyclotetrasiloxane film.

14 Claims, 11 Drawing Sheets

(51) Int. Cl.
*H05B 33/04* (2006.01)
*H05B 33/10* (2006.01)
*H01L 51/52* (2006.01)
*H01L 51/56* (2006.01)

(52) U.S. Cl.
CPC ........ *H01L 51/524* (2013.01); *H01L 51/5256* (2013.01); *H01L 51/56* (2013.01); *H05B 33/04* (2013.01); *H05B 33/10* (2013.01); *H01L 2251/558* (2013.01)

(56) References Cited

U.S. PATENT DOCUMENTS

| | | | | |
|---|---|---|---|---|
| 2005/0029513 | A1* | 2/2005 | Kawashima | C23C 14/024 257/40 |
| 2006/0208634 | A1* | 9/2006 | Schaepkens | B82Y 20/00 313/506 |
| 2006/0270786 | A1* | 11/2006 | Shimizu | C08L 83/04 524/588 |
| 2007/0170455 | A1 | 7/2007 | Choi et al. | |
| 2009/0058275 | A1 | 3/2009 | Aota | |
| 2012/0161620 | A1* | 6/2012 | Song | H01L 51/525 313/512 |
| 2013/0202782 | A1* | 8/2013 | Mandlik | H05B 33/10 427/66 |
| 2014/0167006 | A1* | 6/2014 | Kim | H01L 27/3244 257/40 |

FOREIGN PATENT DOCUMENTS

| | | |
|---|---|---|
| JP | 2009-010400 A | 1/2009 |
| JP | 2009-054444 A | 3/2009 |
| JP | 2009-134984 A | 6/2009 |
| JP | 2011-077258 A | 4/2011 |
| JP | 2012-209209 A | 10/2012 |
| JP | 2013-114772 A | 6/2013 |

\* cited by examiner

ELECTROLUMINESCENCE DEVICE AND METHOD FOR PRODUCING SAME

TECHNICAL FIELD

The present invention relates to an electroluminescence device including an EL (electroluminescence) element, and a method for producing the same.

BACKGROUND ART

In recent years, flat panel displays have been utilized in various products and various fields, and there has been demand for a larger size, higher image quality, and lower power consumption in such flat panel displays.

Under such circumstances, organic EL display devices including an organic EL (electroluminescence) element using the electro luminescence of an organic material have been garnering great attention as all-solid flat panel displays capable of being driven at a low voltage and having good high-speed responsiveness, good self-emission characteristics, and the like.

For example, in an organic EL display device of the active matrix type, a thin film-like organic EL element is provided on a substrate on which TFTs (thin film transistors) are provided. In the organic EL element, an organic EL layer including an emissive layer is stacked between a pair of electrodes. The TFTs are connected to one of the pair of electrodes. Then, a voltage is applied between the pair of electrodes to cause the emissive layer to emit light, whereby an image is displayed.

For the above-described conventional organic EL display device, it has been proposed to seal the organic EL element in order to prevent the organic EL element from being degraded by moisture and oxygen.

Specifically, the above-described conventional organic EL display device includes an organic EL element, a substrate on which the organic EL element is provided, and a sealing substrate disposed so as to oppose the substrate, as described in, for example, Patent Document 1 below. Then, in the conventional organic EL display device, a frame-shaped glass frit is provided between the substrate and the sealing substrate so as to surround the organic EL element, whereby the organic EL element can be sealed.

PRIOR ART DOCUMENT

Patent Document

[Patent Document 1] JP 2007-200890A

DISCLOSURE OF INVENTION

Problem to be Solved by the Invention

However, in the above-described conventional organic EL display device (electroluminescence device), the glass frit is provided by using laser in order to enhance the barrier properties of the organic EL element. Accordingly, the production process is complicated, and the production yield is reduced, resulting in the problem of a cost increase.

In view of the foregoing problem, it is an object of the present invention to provide an electroluminescence device that can be easily produced at a low cost, and has good barrier properties, and a method for producing the same.

Means for Solving Problem

In order to attain the above-described object, an electroluminescence device according to the present invention is an electroluminescence device including:

a substrate and an electroluminescence element provided on the substrate, wherein the electroluminescence device includes a sealing layer that seals the electroluminescence element, the sealing layer is provided with at least a first, a second, and a third sealing film that are sequentially stacked from the electroluminescence element side, the first and third sealing films are each formed of an inorganic film, and the second sealing film is formed of an octamethylcyclotetrasiloxane film.

In the electroluminescence device configured in the above-described manner, the sealing layer that seals the electroluminescence element is provided with at least the first, second, and third sealing films that are sequentially stacked from the electroluminescence element side. Further, the first and third sealing films are each formed of an inorganic film, and the second sealing film is formed of an octamethylcyclotetrasiloxane film. Accordingly, unlike the above-described conventional example, it is possible to form an electroluminescence device that can be easily produced at a low cost and has good barrier properties.

In the above-described electroluminescence device, in the sealing layer, a fourth and a fifth sealing film may be sequentially stacked on the third sealing film, the fourth sealing film may be formed of an octamethylcyclotetrasiloxane film, and the fifth sealing film may be formed of an inorganic film.

In this case, the barrier properties for the electroluminescence element can be readily enhanced, so that it is possible to form an electroluminescence device having better barrier properties.

The above-described electroluminescence device may include an opposing substrate that opposes the substrate on the electroluminescence element side, and a frame-shaped sealing member that seals the electroluminescence element between the substrate and the opposing substrate.

In this case, it is possible to more reliably prevent degradation of the electroluminescence element.

In the above-described electroluminescence device, it is preferable that a filler layer is provided between the substrate, the opposing substrate, and the sealing member.

In this case, it is possible to further enhance the barrier properties for the electroluminescence element.

In the above-described electroluminescence device, it is preferable that a thickness of the octamethylcyclotetrasiloxane film is 50 nm or more.

In this case, a plurality of inorganic films can be readily provided on the octamethylcyclotetrasiloxane film, thus making it possible to readily enhance the barrier properties for the electroluminescence element, and making it easy for the octamethylcyclotetrasiloxane film to function as the planarization film to enable the inorganic films to be readily stacked.

In the above-described electroluminescence device, it is preferable that a thickness of the octamethylcyclotetrasiloxane film is greater than a thickness of the first sealing film.

In this case, even if an uneven level difference is created on the surface on the side of the substrate present below the first sealing film, the influence of the level difference can be suppressed by the octamethylcyclotetrasiloxane film, so that it is possible to readily enhance the barrier properties.

In the above-described electroluminescence device, it is preferable that in the sealing layer, a thickness of the first sealing film is set to be the smallest.

In this case, even if an uneven level difference is created on the surface on the side of the substrate present below the first sealing film, the stress caused by the level difference can be reduced by the first sealing film, so that it is possible to readily enhance the barrier properties.

A method for producing an electroluminescence device according to the present invention is a method for producing an electroluminescence device including a substrate and an electroluminescence element provided on the substrate, the method including:

a first sealing film formation step of forming a first sealing film that is formed of an inorganic film, is provided on the electroluminescence element, and seals the electroluminescence element;

a second sealing film formation step of forming a second sealing film that is formed of an octamethylcyclotetrasiloxane film, is provided on the first sealing film, and seals the electroluminescence element; and a third sealing film formation step of forming a third sealing film that is formed of an inorganic film, is provided on the second sealing film, and seals the electroluminescence element.

In the method for producing an electroluminescence device configured in the above-described manner, the first sealing film formed of an inorganic film is provided on the electroluminescence element. Further, the second sealing film formed of an octamethylcyclotetrasiloxane film is provided on the first sealing film, and the first sealing film formed of an inorganic film is provided on the octamethylcyclotetrasiloxane film. Accordingly, unlike the above-described conventional example, it is possible to form an electroluminescence device that can be easily produced at a low cost and has good barrier properties.

In the above-described method for producing an electroluminescence device, the first and third sealing films may be each formed by using a sputtering method or a CVD method.

In this case, the first and third sealing films can be formed accurately and readily.

In the above-described method for producing an electroluminescence device, the second sealing film may be formed by using a CVD method.

In this case, the second sealing film can be formed accurately and readily.

In the above-described method for producing an electroluminescence device, it is preferable that a first, a second, and a third mask are respectively used in the first, second, and third sealing film formation steps, the first, second, and third masks are respectively provided with a first, a second, and a third opening for forming the first, second, and third sealing films, and the first, second, and third openings become larger in this order.

In this case, the first to third sealing films can be formed appropriately and readily.

Effects of the Invention

According to the present invention, it is possible to provide an electroluminescence device that can be easily produced at a low cost and has good barrier properties, and a method for producing the same.

BRIEF DESCRIPTION OF DRAWINGS

FIG. 2 illustrates main production steps of the organic EL display device, wherein

FIG. 6 illustrates main production steps of the organic EL display device shown in FIG. 5, wherein

FIG. 10 illustrates main production steps of the organic EL display device shown in FIG. 9, wherein

DESCRIPTION OF THE INVENTION

Figure 1:
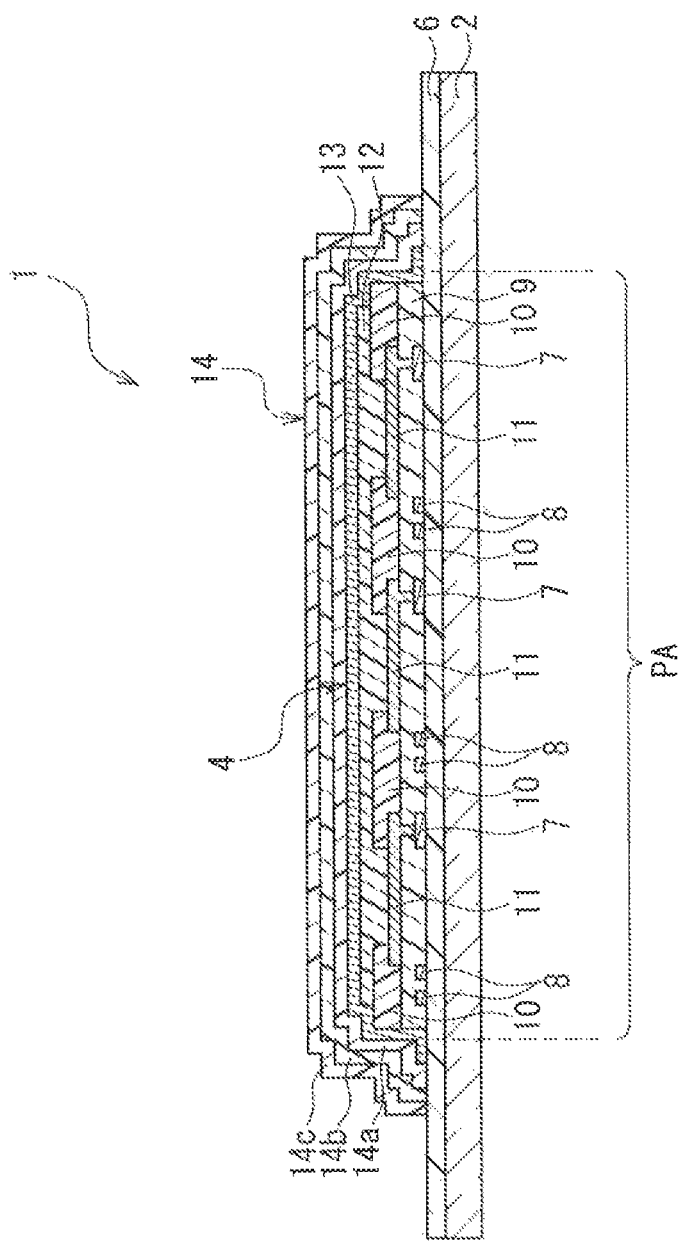
FIG. 1 is a cross-sectional view showing a cross section of an organic EL display device according to a first embodiment of the present invention.

Hereinafter, preferred embodiments of an electroluminescence device and a method for producing the same according to the present invention will be described with reference to the drawings. Note that the following description shows a case where the present invention is applied to an organic EL display device by way of an example. The dimensions of the constituent members in the drawings are not faithful representation of the dimensions of actual constituent members, dimensional ratios of those members, and the like.

First Embodiment

FIG. 1 is a cross-sectional view showing a cross section of an organic EL display device according to a first embodiment of the present invention. In FIG. 1, an organic EL display device 1 of the present embodiment includes a TFT substrate 2 serving as a substrate, and an organic EL element 4 provided on the TFT substrate 2 as an electro luminescence element.

In the organic EL display device 1 of the present embodiment, the organic EL element 4 constitutes a rectangular pixel area PA including a plurality of pixels (including a plurality of sub-pixels), and the organic EL element 4 is sealed by a sealing layer 14. The pixel area PA constitutes a display portion of the organic EL display device 1 and is configured to display information. That is, in the pixel area PA, a plurality of pixels (a plurality of sub-pixels) are arranged in a matrix configuration, and the pixel area PA is configured to display information by the organic EL element 4 emitting light for each sub-pixel.

In FIG. 1, the TFT substrate 2 is formed of, for example, a glass material or a film having flexibility (bendability). Further, the TFT substrate 2 is provided with an underlying film (insulating film) 6 such that the underlying film 6 covers the entire surface of the TFT substrate 2. As illustrated in FIG. 1, in an emissive region of the organic EL display device 1, a TFT (thin film transistor) 7 is provided on the underlying film 6 for each sub-pixel of the pixel area PA. On the underlying film 6, wirings 8 including a plurality of source lines (signal lines) and a plurality of gate lines that are provided in a matrix configuration are formed. A source driver and a gate driver are connected to each source line and each gate line, respectively (not shown), and are configured to drive the TFT 7 provided for each sub-pixel, in accordance with an externally input image signal. The TFT 7 functions as a switching element that controls light emission of the corresponding sub-pixel, and is configured to control light emission of one of red (R), green (G), and blue (B) sub-pixels formed by the organic EL element 4.

Note that the underlying film 6 is used for preventing the characteristics of the TFTs 7 from being degraded by diffusion of impurities from the TFT substrate 2 to the TFTs 7, and may be omitted if there is no worries for such degradation.

As shown in FIG. 1, on the TFT substrate 2, an interlayer insulating film 9, an edge cover 10, and a first electrode 11 of the organic EL element 4 are formed. The interlayer insulating film 9 also functions as a planarization film, and is provided on the underlying film 6 so as to cover the TFTs 7 and the wirings 8. The edge cover 10 is formed on the interlayer insulating film 9 so as to cover edges of the pattern of the first electrode 11. The edge cover 10 also functions as an insulation layer for preventing a short circuit between the first electrode 11 and a second electrode 13, which will be described later. The first electrode 11 is connected to the TFTs 7 via contact holes formed in the interlayer insulating film 9.

The openings of the edge cover 10, i.e., portions where the first electrode 11 is exposed substantially constitute the emissive region of the organic EL element 4. As described above, the organic EL display device 1 of the present embodiment is configured to emit light of one of RGB so as to perform full-color display. Further, the organic EL display device 1 of the present embodiment constitutes a display device of the active matrix type that includes TFTs (thin film transistors) 7.

As shown in FIG. 1, an organic EL layer 12 and a second electrode 13 are formed on the first electrode 11, and the first electrode 11, the organic EL layer 12, and the second electrode 13 constitute the organic EL element 4. That is, the organic EL element 4 is a light-emitting element capable of high-luminance light emission by low-voltage direct-current driving, for example, and includes the first electrode 11, the organic EL layer 12, and the second electrode 13.

Specifically, when the first electrode 11 is an anode, a hole injection layer, a hole transport layer, an emissive layer, an electron transport layer, an electron injection layer, and so forth are stacked (not shown) in this order from the first electrode 11 side as the organic EL layer 12, and the second electrode 13 serving as a cathode is further formed. Apart from the configuration given in this description, it is possible to adopt a single layer having two or more functions such as a layer serving as both the hole injection layer and the hole transport layer. A carrier blocking layer or the like may be inserted in the organic EL layer 12, as needed.

On the other hand, when the second electrode 13 is an anode, the order of the layers in the organic EL layer 12 is reversed from the order described above.

When the first electrode 11 is formed of a transmissive electrode or a semi-transmissive electrode and the second electrode 13 is formed of a reflective electrode, the organic EL display device 1 will be an organic EL display of the bottom-emission type in which light is emitted from the TFT substrate 2 side. That is, the organic EL display device 1 of the bottom-emission type is configured such that the surface of the first electrode 11 that faces the TFT substrate 2 constitutes an effective light-emitting surface of the organic EL element 4 and light is emitted therefrom to the outside.

Conversely, when the first electrode 11 is formed of a reflective electrode and the second electrode 13 is formed of a transmissive electrode or a semi-transmissive electrode, the organic EL display device 1 will be an organic EL display device of the top-emission type in which light is emitted from the sealing layer 14. That is, the organic EL display device 1 of the top-emission type is configured such that the surface of the first electrode 11 that faces the sealing layer 14 constitutes an effective light-emitting surface of the organic EL element 4 and light is emitted therefrom to the outside.

As described above, the organic EL display device 1 of the present embodiment is configured such that the organic EL element 4 is sealed by the sealing layer 14, and penetration (entry) of moisture and oxygen from the outside is prevented by the sealing layer 14 so as to prevent degradation of the organic EL element 4.

In the organic EL display device 1 of the present embodiment, the sealing layer 14 is composed of a plurality of, for example, three sealing films. Specifically the sealing layer 14 includes a first sealing film 14a provided on the organic EL element 4, a second sealing film 14b provided on the first sealing film 14a, and a third sealing film 14c provided on the second sealing film 14b.

The first sealing film 14a is formed of an inorganic film such as SiN, SiON, or $Al_2O_3$. The second sealing film 14b is formed of an octamethylcyclotetrasiloxane (OMCTS) film. The third sealing film 14a is formed of an inorganic film such as SiN, SiON, or $Al_2O_3$, as with the first sealing film 14a.

The thickness of the first sealing film 14a is set to be the smallest in the sealing layer 14. The thickness of the second sealing film 14b (i.e., the thickness of the octamethylcyclotetrasiloxane film) is set to be greater than the thickness of the first sealing film 14a.

Further, the thickness of the second sealing film 14b is set to be, for example, 50 nm or more, more preferably 10 μm or less. Accordingly, in the organic EL display device 1 of the present embodiment, a plurality of inorganic films can be readily provided on the second sealing film 14b, thus making it possible to readily enhance the barrier properties for the organic EL element 4. Furthermore, in the organic EL display device 1 of the present embodiment, it is easy for the second sealing film 14b to function as a planarization film to enable the inorganic films to be readily stacked.

When the thickness of the second sealing film 14b is set to be less than 50 nm, it is difficult for the second sealing film 14b to function as a planarization film, making it difficult to stack the inorganic films.

On the other hand, when the thickness of the second sealing film 14b is set to be greater than 10 μm, it is difficult to readily provide a plurality of inorganic films on the second sealing film 14b.

Specifically, in the sealing layer 14 of the organic EL display device 1 of the present embodiment, the first sealing film 14a has a thickness of, for example, 10 nm, and is formed of $Al_2O_3$. The second sealing film 14b has a thickness of, for example, 50 nm. The third sealing film 14c has a thickness of for example, 50 nm, and is formed of SiN.

Next, production steps of the organic EL display device 1 of the present embodiment will be described in detail with reference to FIGS. 2 to 4. Note that the following description is mainly focused on the production steps of the sealing layer 14.

Figure 3:
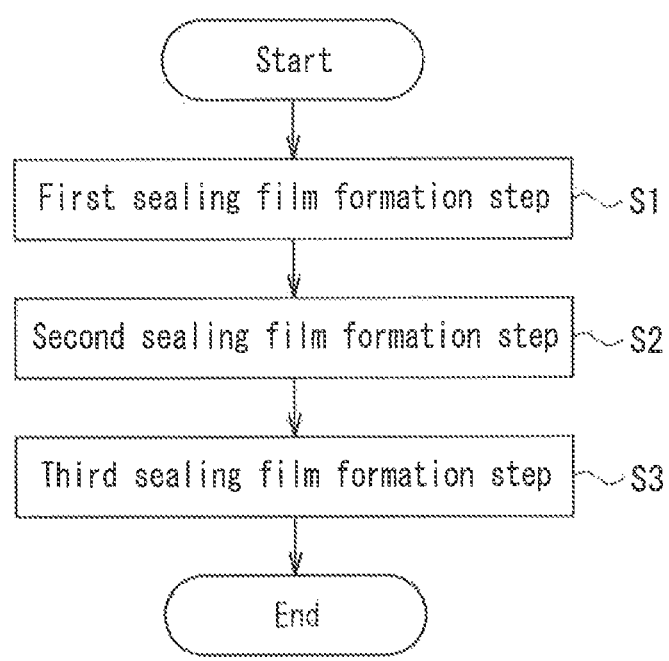
FIG. 3 is a flowchart showing main production steps of the organic EL display device.
Figure 4A:
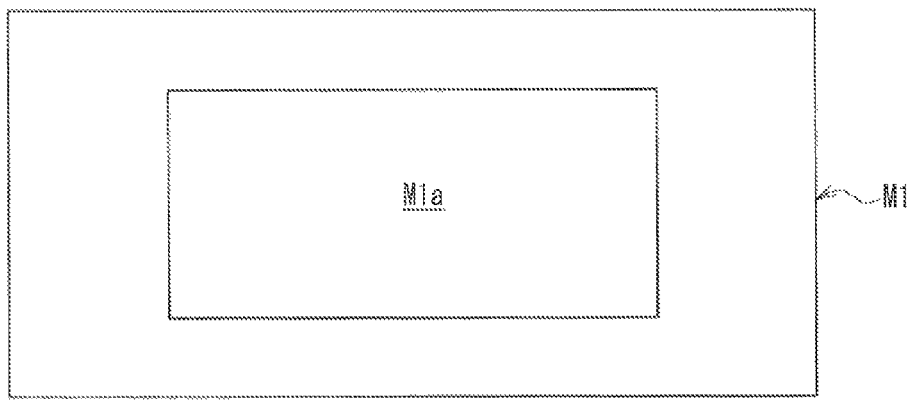
FIGS. 4A to 4C are diagrams illustrating masks respectively used in the first to third sealing film formation steps shown in FIG. 3.
Figure 4B:
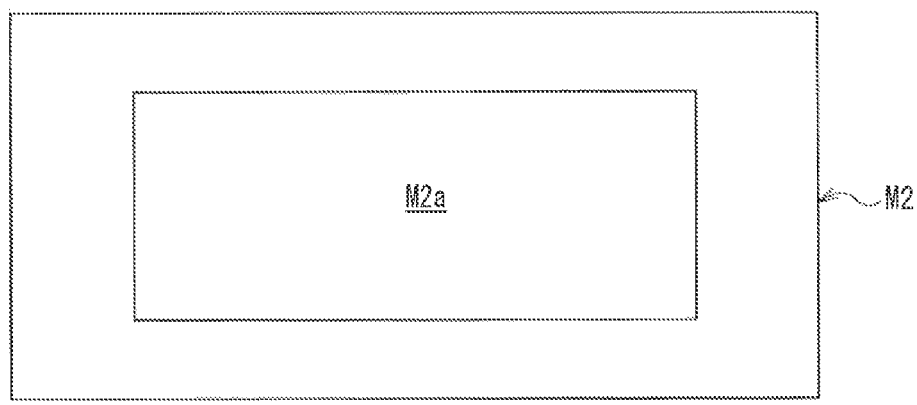
Figure 4C:
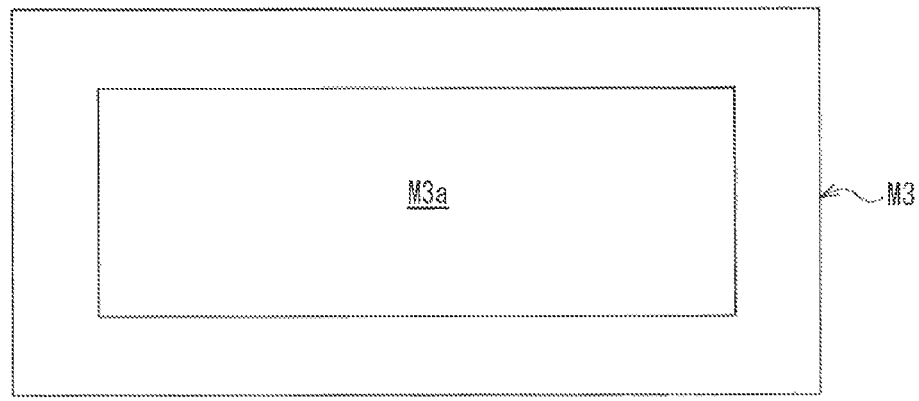

FIG. 2 illustrates main production steps of the above-described organic EL display device, wherein FIGS. 2A to 2D are diagrams illustrating a series of the main production steps. FIG. 3 is a flowchart showing the main production steps of the organic EL display device. FIGS. 4A to 4C are diagrams illustrating masks respectively used in the first to third sealing film formation steps shown in FIG. 3.

Figure 2A:
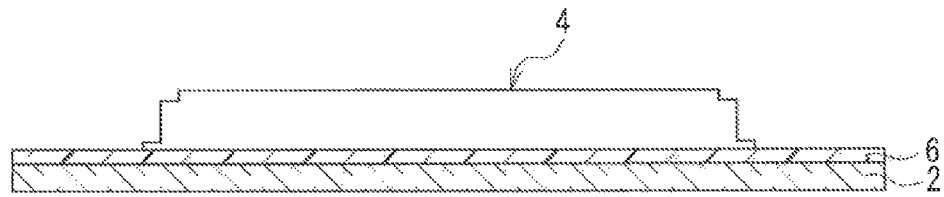
FIG. 2A to FIG. 2D are diagrams illustrating a series of the main production steps.

As shown in FIG. 2A, an organic EL element 4 is formed on a TFT substrate 2. Thereafter, a first sealing film formation step, a second sealing film formation step, and a third sealing film formation step respectively shown in steps S1 to S3 in FIG. 3 are sequentially performed, whereby a sealing layer 14 that seals the organic EL element 4 is provided on the organic EL element 4.

Figure 2B:
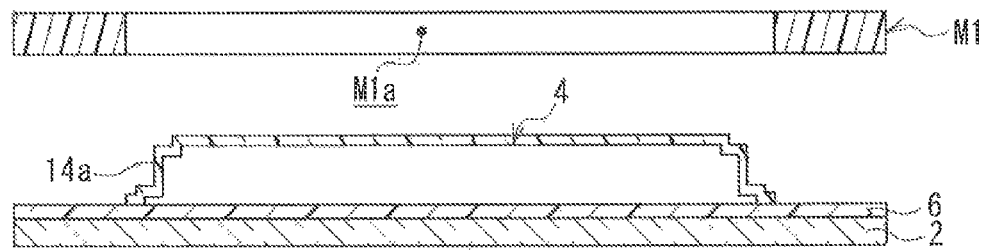

That is, the first sealing film formation step is performed as shown in FIG. 2B. In the first sealing film formation step, for example, a first sealing film 14a is formed by using, for example, a sputtering method or a CVD method so as to cover the organic EL element 4, so that the first sealing film 14a can be formed accurately and readily. In the first sealing film formation step, a first mask M1 having a first opening M1a is used, and the material for forming the first sealing film 14a is supplied onto the organic EL element 4 through the first opening M1a.

Figure 2C:
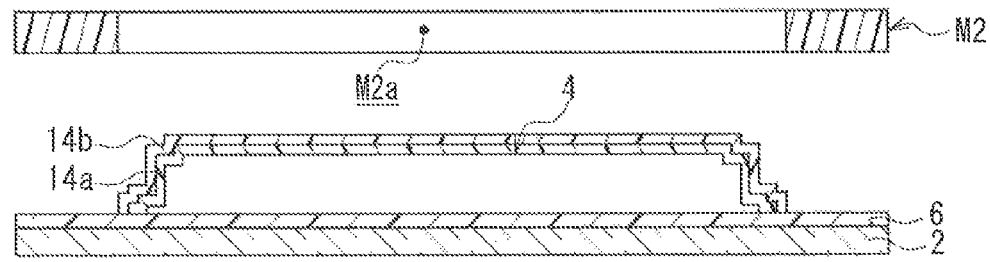

Next, the second sealing film formation step is performed as shown in FIG. 2C. In the second sealing film formation step, a second sealing film 14b is formed by using, for example, a CVD method such as a high-frequency plasma CVD method so as to cover the first sealing film 14a, so that the second sealing film 14b can be formed accurately and readily. In the second sealing film formation step, a second mask M2 having a second opening M2a is used, and the material for forming the second sealing film 14b is supplied onto the first sealing film 14a through the second opening M2a.

Figure 2D:
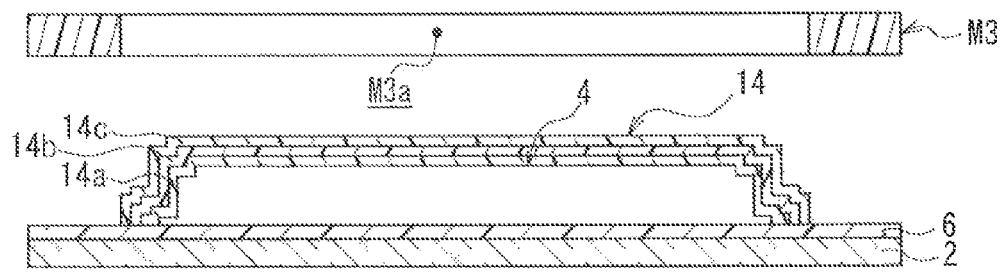

Subsequently, the third sealing film formation step is performed as shown in FIG. 2D. In the third sealing film formation step, a third sealing film 14c is formed by using, for example, a sputtering method or a CVD method so as to cover the second sealing film 14b, so that the third sealing film 14c can be formed accurately and readily. In the third sealing film formation step, a third mask M3 having a third opening M3a is used, and the material for forming the third sealing film 14c is supplied onto the second sealing film 14b through the third opening M3a.

As respectively shown in FIGS. 4A to 4C, the first to third masks M1 to M3 are configured such that their openings M1a to M3a become larger in this order. Accordingly, in the organic EL display device 1 of the present embodiment, the first to third sealing films 14a to 14c can be formed appropriately and readily.

In the organic EL display device 1 of the present embodiment configured in the above-described manner, the first, second, and third sealing film 14a, 14b, and 14c that are sequentially stacked from the organic EL element 4 side are provided in the sealing layer 14 that seals the organic EL element (electroluminescence element) 4. The first and third sealing films 14a and 14c are each formed of an inorganic film, and the second sealing film 14b is formed of an octamethylcyclotetrasiloxane film. Accordingly, even if pinholes or cracks are formed in the first sealing film 14a or the film stress in the first sealing film 14a has caused interfacial separation, the pinholes or cracks formed in the first sealing film 14a or the interfacial separation of the first sealing film 14a can be suppressed by the second sealing film 14b formed of an octamethylcyclotetrasiloxane film, making it possible to prevent a reduction of the barrier properties for the organic EL element 4.

In the organic EL display device 1 of the present embodiment, the first to third sealing films 14a to 14c of the sealing layer 14 are formed without using laser. Therefore, it is possible to form the sealing layer 14 while suppressing the detrimental effect of heat on the TFT substrate 2 on which the organic EL element 4 is provided. Accordingly, unlike the above-described conventional example, an organic EL display device 1 that can be easily produced at a low cost and has good barrier properties can be formed in the present embodiment.

In the present embodiment, the thickness of the second sealing film (octamethylcyclotetrasiloxane film) 14b is 50 nm or more, and therefore, a plurality of inorganic films can be readily formed on the second sealing film 14b, thus making it possible to readily improve the barrier properties for the organic EL element 4, and making it easy for the second sealing film 14b to function as a planarization film to enable the inorganic films to be readily stacked.

In the present embodiment, the thickness of the second sealing film 14b is greater than the thickness of the first sealing film 14a, and therefore, even if an uneven level difference is created on the surface on the side of the TFT substrate (substrate) 2 present below the first sealing film 14a, the influence of the level difference can be suppressed by the second sealing film 14b, making it possible to readily improve the barrier properties.

In the present embodiment, the thickness of the first sealing film 14a is set to be the smallest in the sealing layer 14, and therefore, even if an uneven level difference is created on the surface on the side of the TFT substrate 2 present below the first sealing film 14a, the stress caused by the level difference can be suppressed by the first sealing film 14a, making it possible to readily improve the barrier properties.

Second Embodiment

Figure 5:
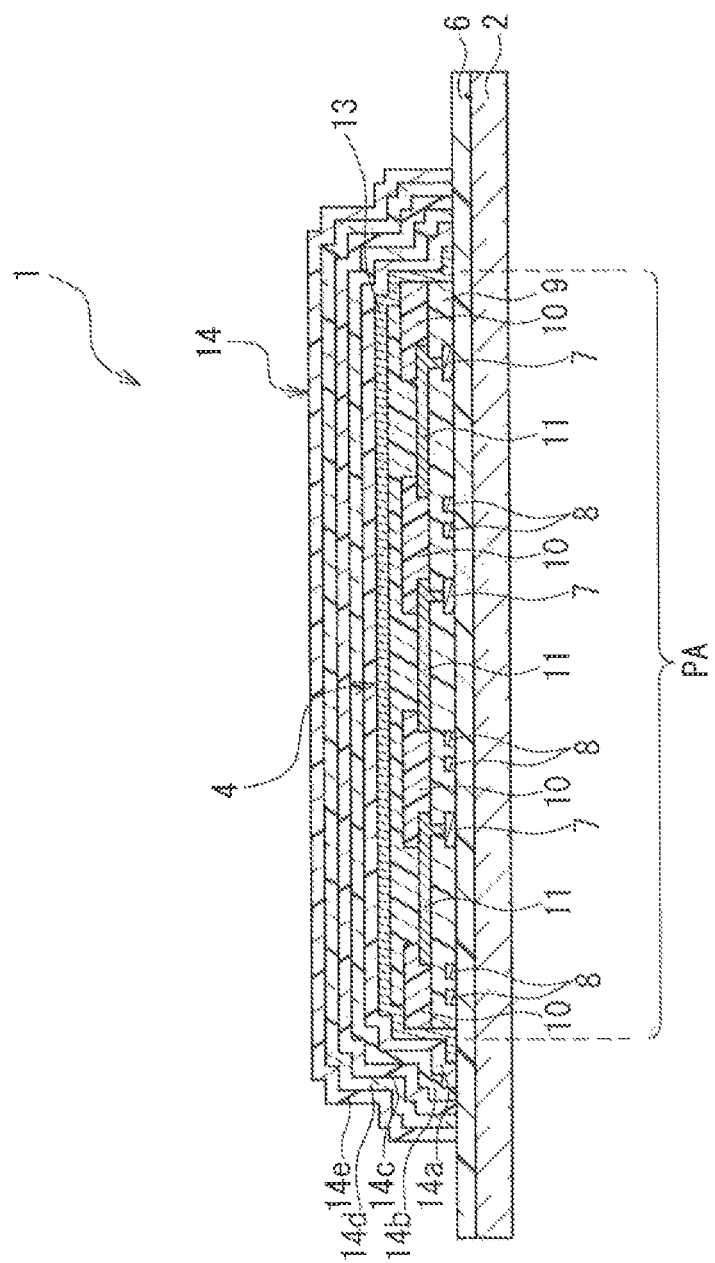
FIG. 5 is a cross-sectional view showing a cross section of an organic EL display device according to a second embodiment of the present invention.

FIG. 5 is a cross-sectional view showing a cross section of an organic EL display device according to a second embodiment of the present invention.

In FIG. 5, a main difference between the present embodiment and the above-described first embodiment is that a fourth sealing film formed of an octamethylcyclotetrasiloxane film and a fifth sealing film formed of an inorganic film are sequentially provided on the third sealing film. Note that elements common to those of the above-described first embodiment are denoted by the same reference numerals, and redundant description thereof has been omitted.

That is, as shown in FIG. 5, in an organic EL display device 1 of the present embodiment, a fourth sealing film 14d is provided so as to cover the third sealing film 14c, and a fifth sealing film 14e is provided so as to cover the fourth sealing film 14d.

The fourth sealing film 14d is formed of an octamethylcyclotetrasiloxane film, as with the second sealing film 14b. The thickness of the fourth sealing film 14d is set to be, for example, 50 nm, as with the second sealing film 14b. As with the first and third sealing films 14a and 14c, the fifth sealing film 14e is formed of for example, an inorganic film such as SiN, SiON, or $Al_2O_3$. The thickness of the fifth sealing film 14e is set to be, for example, 50 nm, as with the third sealing film 14c.

Next, production steps of the organic EL display device 1 of the present embodiment will be described in detail with reference to FIGS. 6 to 8. Note that the following description is mainly focused on the production steps of the fourth and fifth sealing films 14d and 14e.

Figure 6A:
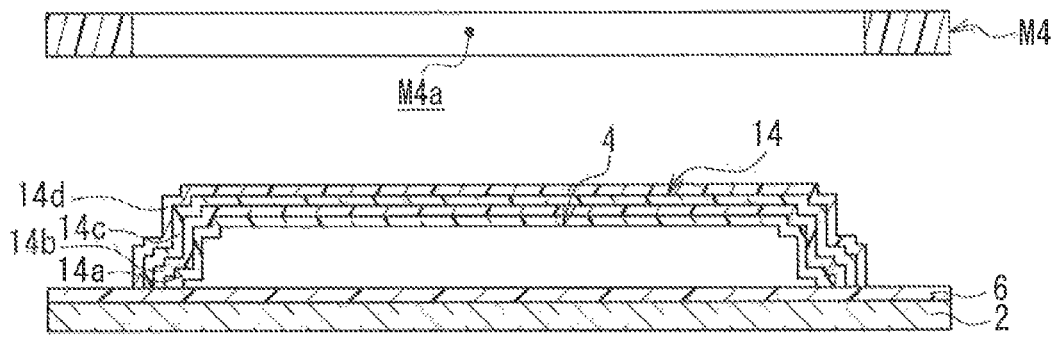
FIGS. 6A and 6B are diagrams illustrating a series of main production steps performed after the production step shown in FIG. 2D.
Figure 6B:
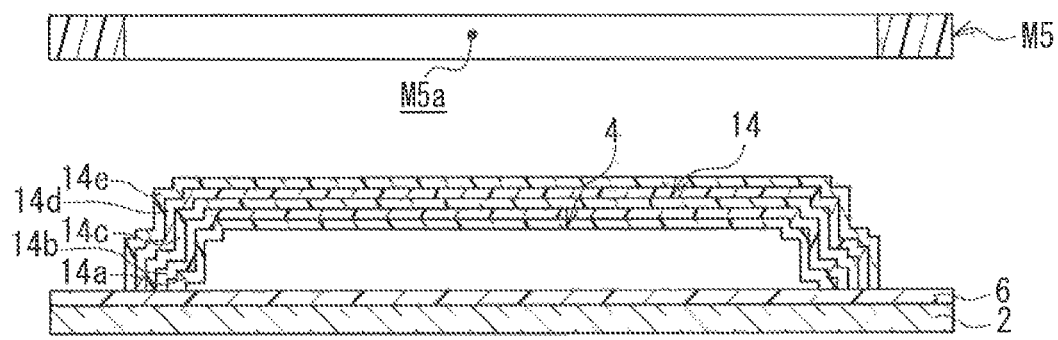

FIG. 6 illustrates main production steps of the organic EL display device shown in FIG. 5, wherein FIG. 6A and FIG. 6B are diagrams illustrating a series of main production steps performed after the production step shown in FIG. 2D. FIG. 7 is a flowchart showing the main production steps of the organic EL display device shown in FIG. 5. FIGS. 8A and 8B are diagrams illustrating masks respectively used in the fourth to fifth sealing film formation steps shown in FIG. 7.

Figure 7:
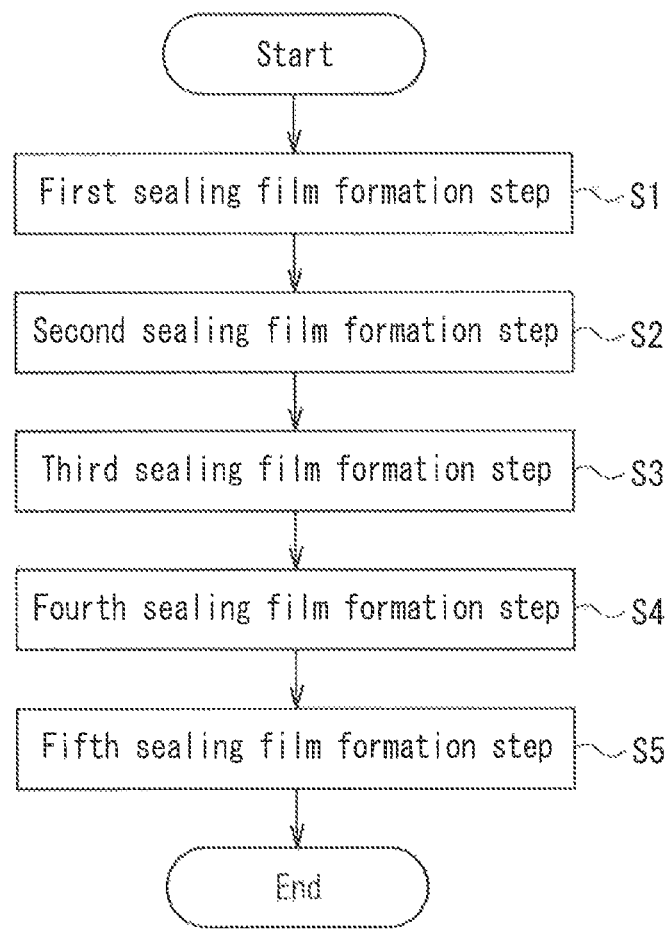
FIG. 7 is a flowchart showing main production steps of the organic EL display device shown in FIG. 5.
Figure 8A:
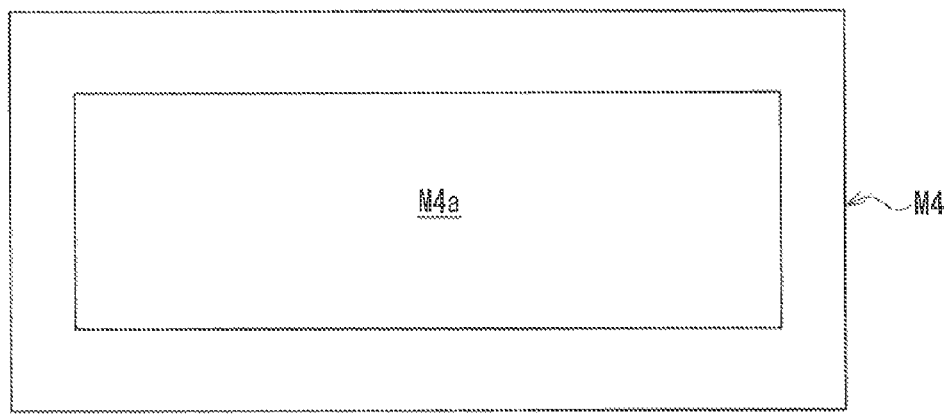
FIGS. 8A and 8B are diagrams illustrating masks respectively used in the fourth to fifth sealing film formation steps shown in FIG. 7.
Figure 8B:
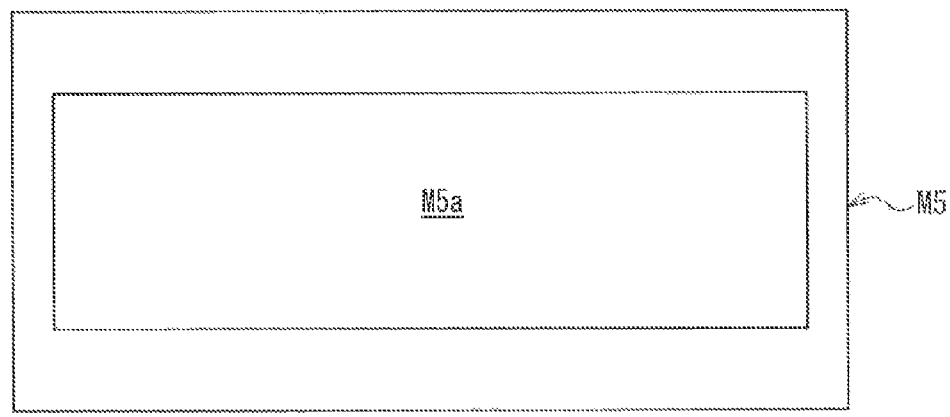

In the organic EL display device 1 of the present embodiment, after the formation step of the third sealing film 14c shown in FIG. 2D, a fourth sealing film formation step and a fifth sealing film formation step respectively shown in steps S4 and S5 in FIG. 7 are performed, whereby a sealing layer 14 that seals the organic EL element 4 is provided on the organic EL element 4.

That is, the fourth sealing film formation step is performed as shown in FIG. 6A. In the fourth sealing film formation step, a fourth sealing film 14d is formed by using, for example, a CVD method such as a high-frequency plasma CVD method so as to cover the third sealing film 14c, such that the fourth sealing film 14d can be formed accurately and readily. In the fourth sealing film formation step, a fourth mask M4 having a fourth opening M4a is used, and the material for forming the fourth sealing film 14d is supplied onto the third sealing film 14c through the fourth opening M4a.

Subsequently, the fifth sealing film formation step is performed as shown in FIG. 6B. In the fifth sealing film formation step, a fifth sealing film 14e is formed by using, for example, a sputtering method or a CVD method so as to cover the fourth sealing film 14d, such that the fifth sealing film 14e can be formed accurately and readily. In the fifth sealing film formation step, a fifth mask M5 having a fifth opening M5a is used, and the material for forming the fifth sealing film 14e is supplied onto the fourth sealing film 14d through the fifth opening M5a.

As respectively shown in FIGS. 8A and 8B, the fourth and fifth masks M4 and M5 are configured such that the openings M4a and M5a thereof become larger in this order. The opening M4a is configured to be larger than the opening M3a of the third mask M3 shown in FIG. 4C. Accordingly the organic EL display device 1 of the present embodiment is configured such that the first to fifth sealing films 14a to 14e can be formed appropriately and readily.

With the above-described configuration, the present embodiment can achieve the same operation and effect as those of the above-described first embodiment. In the present embodiment, the fourth and fifth sealing films 14d and 14e are sequentially stacked on the third sealing film 13c in the sealing layer 14. The fourth sealing film 14d is formed of an octamethylcyclotetrasiloxane film, and the fifth sealing film 14e is formed of an inorganic film. Accordingly the present embodiment can readily enhance the barrier properties for the organic EL element 4, and can form an organic EL display device 1 having better barrier properties.

Third Embodiment

Figure 9:
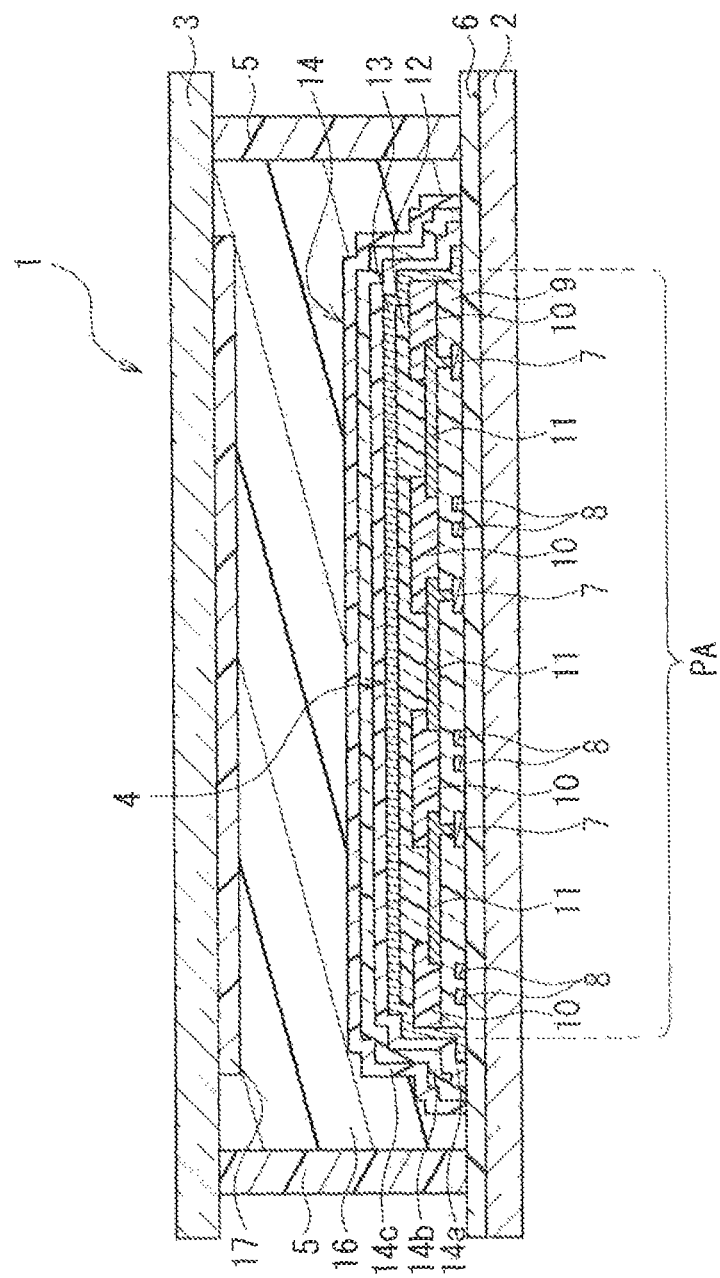
FIG. 9 is a cross-sectional view showing a cross section of an organic EL display device according to a third embodiment of the present invention.

FIG. 9 is a cross-sectional view showing a cross section of an organic EL display device according to a third embodiment of the present invention.

In FIG. 9, a main difference between the present embodiment and the above-described first embodiment is that an opposing substrate that opposes a TFT substrate on the organic EL element side and a frame-shaped sealing member that encapsulates an organic EL element between the TF1 substrate and the opposing substrate are provided. Note that elements common to those of the above-described first embodiment are denoted by the same reference numerals, and redundant description thereof has been omitted.

That is, in FIG. 9, in the organic EL display device 1 of the present embodiment, the organic EL element 4 is encapsulated by a TFT substrate 2, an opposing substrate 3 provided so as to oppose the TFT substrate 2, and a frame-shaped sealing member 5 provided between the TF1 substrate 2 and the opposing substrate 3.

For the opposing substrate 3, for example, a glass material or a film having flexibility (bendability) is used, as with the TFT substrate 2. A color filter 17 is provided on the surface of the opposing substrate 3 that faces the organic EL element 4, so that the emission characteristics such as the emission quality of the above-described sub-pixels of RGB can be enhanced.

The sealing member 5 may be formed of for example, a material in which spacers that define a cell gap between the TF1 substrate 2 and the opposing substrate 3 and inorganic particles are dispersed in a resin such as an epoxy resin. As shown in FIG. 9, the sealing member 5 is formed in the shape of a frame around the pixel area PA. As a result of inorganic particles being dispersed therein, the sealing member 5 can further reduce the moisture permeability.

In the organic EL display device 1 of the present embodiment, a filler layer 16 is provided between the TFT substrate 2, the opposing substrate 3, and the sealing member 5 so as to cover the organic EL element 4. For the filler layer 16, for example, a material in which a metal oxide such as aluminum hydroxide or calcium oxide and activated carbon are dispersed in a resin is used.

Next, production steps of the organic EL display device 1 according to the present embodiment will be described in detail with reference to FIGS. 10 and 11. Note that the following description is mainly focused on an attachment step of the TFT substrate 2 and the opposing substrate 3.

Figure 10A:
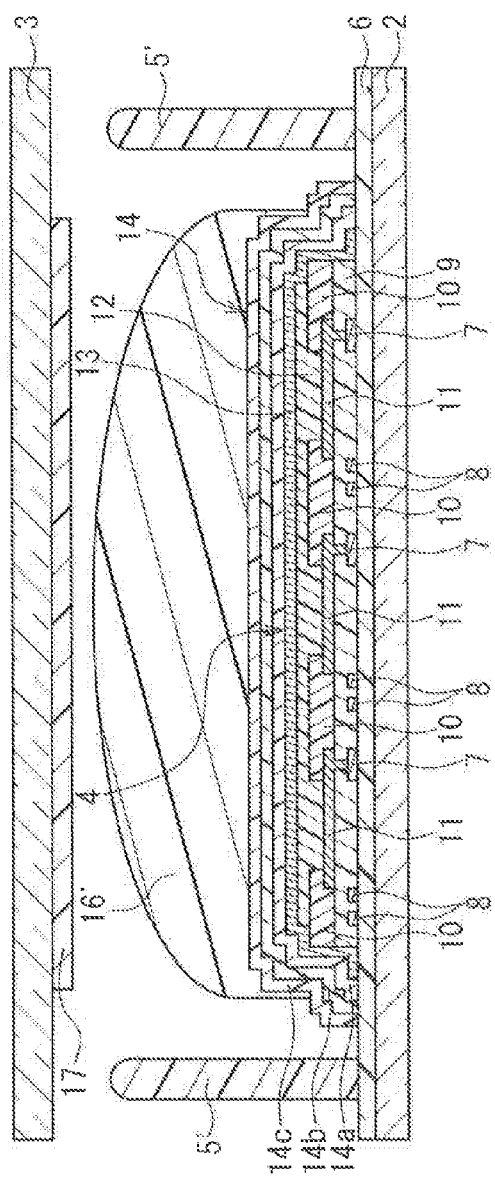
FIGS. 10A and 10B are diagrams illustrating a series of main production steps performed after the production step shown in FIG. 2D.
Figure 10B:
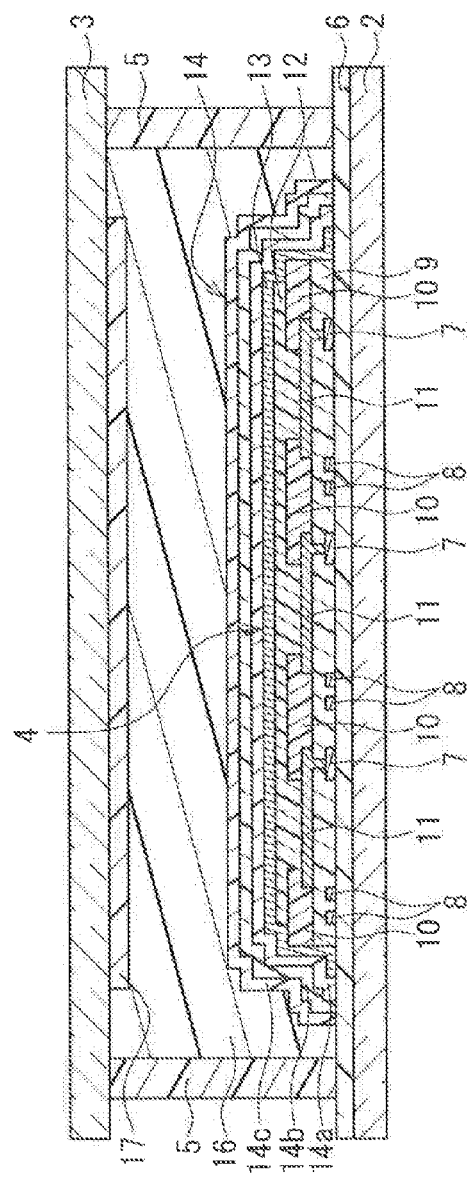

FIG. 10 illustrates main production steps of the organic EL display device shown in FIG. 9, wherein FIGS. 10A and 10B are diagrams illustrating a series of main production steps performed after the production step shown in FIG. 2D. FIG. ibis a flowchart showing the main production steps of the organic EL display device shown in FIG. 9.

As shown in FIG. 10A on the TFT substrate 2 side, the organic EL element 4 and the sealing layer 14 are formed on the TFT substrate 2. On the TFT substrate 2, a sealing member 5' is provided in the shape of a frame so as to surround the organic EL element 4, and a filler layer 16' is placed on the sealing layer 14.

On the other hand, on the opposing substrate 3 side, a color filter 17 is formed on the surface of the opposing substrate 3 that faces the organic EL element 4.

Figure 11:
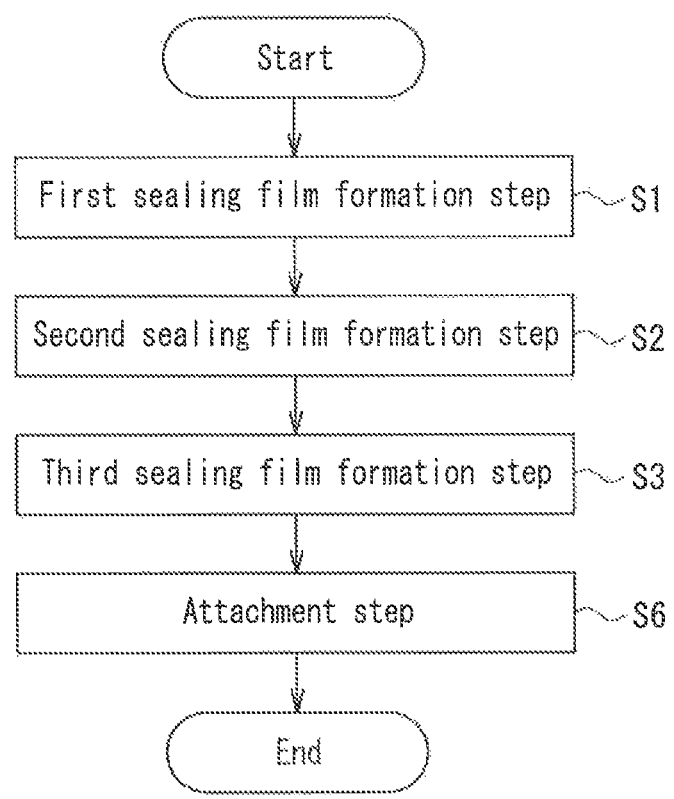
FIG. 11 is a flowchart showing main production steps of the organic EL display device shown in FIG. 9.

Then, as shown in step S6 in FIG. 11, an attachment step of attaching the TFT substrate 2 and the opposing substrate 3 to each other is performed. In the attachment step, as shown in FIG. 10B, the TFT substrate 2 is attached to the opposing substrate 3 under a vacuum atmosphere (e.g., 100 Pa or less). This completes an organic EL display device 1 of the present embodiment.

With the above-described configuration, the present embodiment can achieve the same operation and effect as those of the above-described first embodiment.

In the present embodiment, the opposing substrate 3 that opposes the TFT substrate 2 on the organic EL element 4 side, and the frame-shaped sealing member 5 that encapsulates the organic EL element 4 between the TFT substrate 2 and the opposing substrate 3 are provided. Accordingly, with the present embodiment, it is possible to more reliably prevent degradation of the organic EL element 4.

Since the filler layer 16 is provided between the TFT substrate 2, the opposing substrate 3, and the sealing member 5 in the present embodiment, it is possible to further enhance the barrier properties for the organic EL element 4.

Note that the above-described embodiments are all illustrative and not limiting. The technical scope of the present invention is defined by the claims, and all changes within a range equivalent to the configurations recited in the claims are also included in the technical scope of the present invention.

For example, the foregoing description has illustrated a case where an organic EL element is used as the electroluminescence element. However, the present invention is not limited thereto, and an inorganic EL element including an inorganic compound may be used, for example.

Furthermore, the present invention is not limited in any way as long as the electroluminescence device includes a substrate, an electric element provided on the substrate, a sealing layer that seals the electric element, wherein the sealing layer is provided with at least a first, a second, and a third sealing film that are sequentially stacked from the electric element side, the first and third sealing films are each formed of an inorganic film, and the second sealing film is formed of an octamethylcyclotetrasiloxane film.

Although the foregoing description has described a case where the present invention is applied to an organic EL display device of the active matrix type that includes TFTs (thin film transistors) 7, the present invention is not limited thereto, and is also applicable to an organic EL display device of the passive matrix type in which no thin film transistor is provided.

Although the foregoing description has described a case where the present invention is applied to an organic EL display device, the present invention is not limited thereto, and is also applicable, for example, to a lighting device such as a backlight device.

The above first and third embodiments have described a configuration in which the sealing layer is provided with the first to third sealing films, and the second embodiment has described a configuration in which the sealing layer is provided with the first to fifth sealing films. However, the present invention is not limited thereto as long as the electroluminescence device includes a sealing layer in which a first sealing film formed of an inorganic film is formed on an electric element (organic EL element), a second sealing film formed of an octamethylcyclotetrasiloxane film is formed on the first sealing film, and a third sealing film formed of an inorganic film is provided on the second sealing film.

Aside from the configurations described in the foregoing description, it is possible to adopt a configuration in which the second and third embodiments are appropriately combined.

INDUSTRIAL APPLICABILITY

The present invention is useful for an electroluminescence device that can be easily produced at a low cost and has good barrier properties, and a method for producing the same.

DESCRIPTION OF REFERENCE NUMERALS

1 Organic EL display device
2 TFT substrate (substrate)
3 Opposing substrate
4 Organic EL element (electroluminescence element)
5 Sealing member
14 Sealing layer
14a First sealing film
14b Second sealing film
14c Third sealing film
14d Fourth sealing film
14e Fifth sealing film
16 Filler layer
M1 First mask
M2 Second mask
M3 Third mask

The invention claimed is:

1. An electroluminescence device comprising:
a substrate and an electroluminescence element provided on the substrate, wherein
the electroluminescence device includes a sealing layer that seals the electroluminescence element,
the sealing layer is provided with at least a first, a second, and a third sealing film that are sequentially stacked from the electroluminescence element side,
the first and third sealing films are each formed of an inorganic film,
the second sealing film is formed of an octamethylcyclotetrasiloxane film, and
in the sealing layer, a thickness of the first sealing film is smallest out of all sealing films and a thickness of the third sealing film is identical to a thickness of the second sealing film in a pixel area in which a plurality of pixels are arranged in a matrix.

2. The electroluminescence device according to claim 1, wherein
in the sealing layer, a fourth and a fifth sealing film are sequentially stacked on the third sealing film,
the fourth sealing film is formed of an octamethylcyclotetrasiloxane film, and
the fifth sealing film is formed of an inorganic film.

3. The electroluminescence device according to claim 2, wherein a thickness of the fourth sealing film and a thickness of the fifth sealing film are identical to the thickness of the second sealing film in the pixel area.

4. The electroluminescence device according to claim 1, further comprising:
an opposing substrate that opposes the substrate on the electroluminescence element side; and
a frame-shaped sealing member that seals the electroluminescence element between the substrate and the opposing substrate.

5. The electroluminescence device according to claim 4, wherein a filler layer is provided between the substrate, the opposing substrate, and the sealing member.

6. The electroluminescence device according to claim 1, wherein a thickness of the octamethylcyclotetrasiloxane film is 50 nm or more.

7. The electroluminescence device according to claim 1, wherein a thickness of the octamethylcyclotetrasiloxane film is greater than a thickness of the first sealing film.

8. The electroluminescence device according to claim 1, wherein the first, second, and third sealing films become broader in this order.

9. The electroluminescence device according to claim 1, wherein
an underlying film is provided on the substrate such that the underlying film covers an entire surface of the substrate,
a TFT, a source line, and a gate line are provided on the underlying film, and
the first, second, and third sealing films are in contact with the underlying film at a periphery of the substrate.

10. The electroluminescence device according to claim 1, wherein
an underlying film is provided on the substrate such that the underlying film covers an entire surface of the substrate,
the electroluminescence element includes a first electrode, an EL layer, and a second electrode in this order from the substrate side, and
the second electrode is in contact with the underlying film at a periphery of the substrate.

11. A method for producing an electroluminescence device including a substrate and an electroluminescence element provided on the substrate, the method comprising:

a first sealing film formation step of forming a first sealing film that is formed of an inorganic film, is provided on the electroluminescence element, and seals the electroluminescence element;
a second sealing film formation step of forming a second sealing film that is formed of an octamethylcyclotetrasiloxane film, is provided on the first sealing film, and seals the electroluminescence element;
a third sealing film formation step of forming a third sealing film that is formed of an inorganic film, is provided on the second sealing film, and seals the electroluminescence element, wherein
a thickness of the first sealing film is smallest out of all sealing films and a thickness of the third sealing film is identical to a thickness of the second sealing film in a pixel area in which a plurality of pixels are arranged in a matrix.

12. The method for producing an electroluminescence device according to claim 11, wherein the first and third sealing films are each formed by using a sputtering method or a CVD method.

13. The method for producing an electroluminescence device according to claim 11, wherein the second sealing film is formed by using a CVD method.

14. The method for producing an electroluminescence device according to claim 11, wherein
a first, a second, and a third mask are respectively used in the first, second, and third sealing film formation steps,
the first, second, and third masks are respectively provided with a first, a second, and a third opening for forming the first, second, and third sealing films, and
the first, second, and third openings become larger in this order.

* * * * *